(12) United States Patent
Kong et al.

(10) Patent No.: US 7,869,212 B2
(45) Date of Patent: Jan. 11, 2011

(54) HEAT DISSIPATION DEVICE

(75) Inventors: Cheng Kong, Shenzhen (CN);
Hong-Cheng Yang, Shenzhen (CN)

(73) Assignees: Fu Zhun Precision Industry (Shen Zhen) Co., Ltd., Shenzhen, Guangdong Province (CN); Foxconn Technology Co., Ltd., Tucheng, Taipei County (TW)

( * ) Notice: Subject to any disclaimer, the term of this patent is extended or adjusted under 35 U.S.C. 154(b) by 39 days.

(21) Appl. No.: 12/417,663

(22) Filed: Apr. 3, 2009

(65) Prior Publication Data

US 2010/0172094 A1    Jul. 8, 2010

(30) Foreign Application Priority Data

Jan. 7, 2009    (CN) .................. 2009 1 0300091

(51) Int. Cl.
*H05K 7/20* (2006.01)

(52) U.S. Cl. ............. 361/695; 361/676.46; 361/679.47; 361/679.48; 361/679.54; 361/697; 165/80.3; 165/104.33; 165/121

(58) Field of Classification Search ............ 361/679.46, 361/679.47, 679.48, 679.54, 690–697, 702–712, 361/715, 717–720; 165/80.2, 80.3, 104.33, 165/104.34, 120–12, 185; 174/16.1, 16.3; 257/E23.084, E23.086, E23.099, 717, 718, 257/719, 723; 24/453, 457; 248/505, 510
See application file for complete search history.

(56) References Cited

U.S. PATENT DOCUMENTS

| | | | |
|---|---|---|---|
| 6,308,773 B2 * | 10/2001 | Lin | 165/80.3 |
| 6,435,467 B1 * | 8/2002 | Lai | 248/500 |
| 6,600,650 B1 * | 7/2003 | Lee | 361/697 |
| 6,896,046 B2 * | 5/2005 | Lee et al. | 165/185 |
| 6,935,410 B2 * | 8/2005 | Lee et al. | 165/80.3 |
| 7,086,456 B2 * | 8/2006 | Lee et al. | 165/121 |
| 7,289,330 B2 * | 10/2007 | Lu et al. | 361/710 |
| 7,301,769 B2 * | 11/2007 | Li et al. | 361/697 |
| 7,423,873 B2 * | 9/2008 | Shuai et al. | 361/697 |
| 7,637,310 B2 * | 12/2009 | Li et al. | 165/80.3 |
| 7,639,497 B2 * | 12/2009 | Xu | 361/697 |
| 2004/0000398 A1 * | 1/2004 | Lee et al. | 165/185 |
| 2008/0130229 A1 * | 6/2008 | Chen et al. | 361/697 |

FOREIGN PATENT DOCUMENTS

JP    02008141164 A  *  7/2008
TW    200827997 A  *  7/2008

* cited by examiner

*Primary Examiner*—Michael V Datskovskiy
(74) *Attorney, Agent, or Firm*—Frank R. Niranjan

(57) ABSTRACT

A heat dissipation device includes a heat sink, a fan mounted on a top side of the heat sink, and a wire clip pivotally engaging with the heat sink and pressing the fan toward the heat sink. The heat sink includes a base, and a plurality of fins extending from the base. The fan includes a bracket. The clip includes a pivoting portion pivotally engaging with a fin of the heat sink, an engaging portion connecting with an end of the pivoting portion and an operating portion extending from another end of the pivoting portion. The operating portion is pressed downwardly to engage with the heat sink and to cause the engaging portion to rotate towards the fan and press the bracket of the fan toward the heat sink thereby securing the fan to the heat sink.

18 Claims, 5 Drawing Sheets

HEAT DISSIPATION DEVICE

BACKGROUND

1. Technical Field

The present disclosure relates to heat dissipation devices, and particularly, to a fan of being conveniently assembled to and disassembled from a heat sink, and a heat dissipation device having such a fan and a heat sink.

2. Description of Related Art

A heat sink is usually placed in thermal contact with a heat generating electronic device such as a central processing unit (CPU), and transfers heat through conduction away from the heat generating electronic device so as to prevent over-heating of the heat generating electronic device.

Conventionally, a fan is mounted on a side of the heat sink to improve heat dissipation efficient of the heat sink. The fan and the heat sink are assembled together by a number of screws. The screws are assembled to and disassembled from the heat sink one by one. This is very time-consuming and trouble.

What is needed, therefore, is a fan of being conveniently assembled to and disassembled from a heat sink, and a heat dissipation device including such a heat sink and a fan, thereby overcoming the above-described problems.

DETAILED DESCRIPTION

Figure 1:
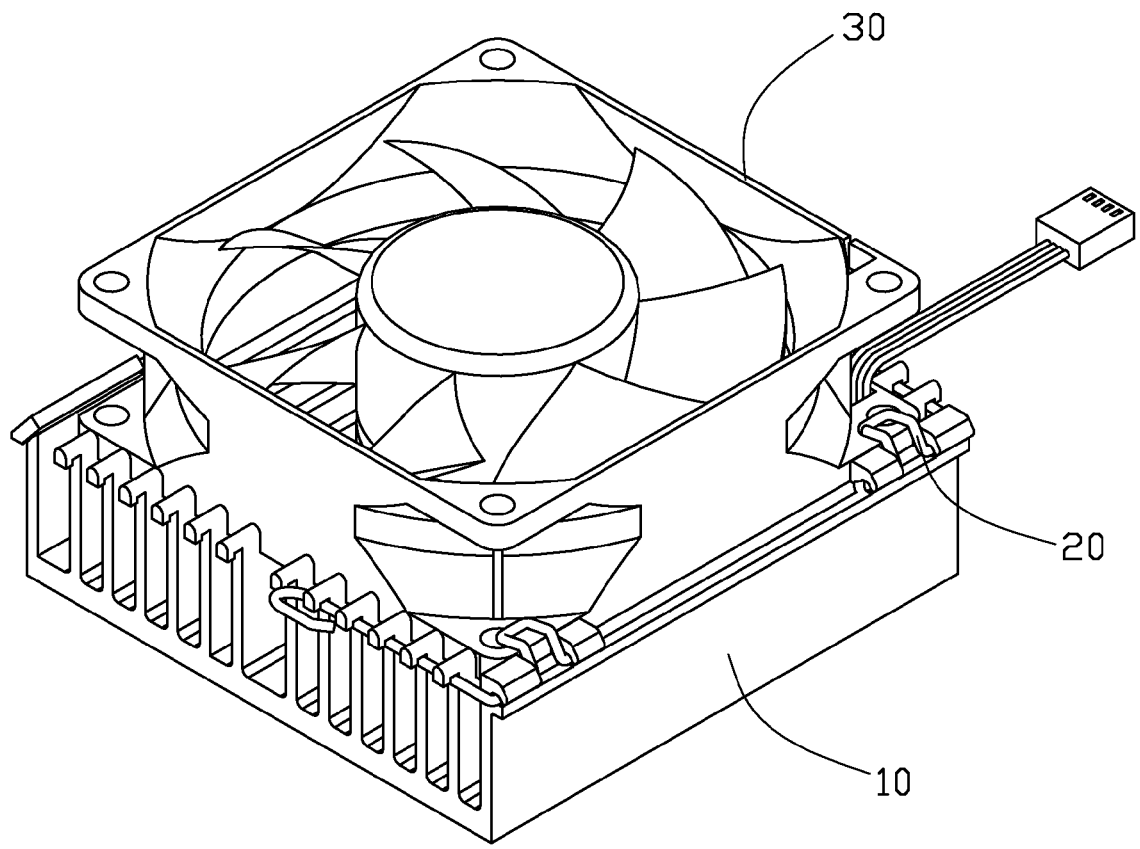
FIG. 1 is an assembled view of a heat dissipation device in accordance with an embodiment of the present disclosure.
Figure 2:
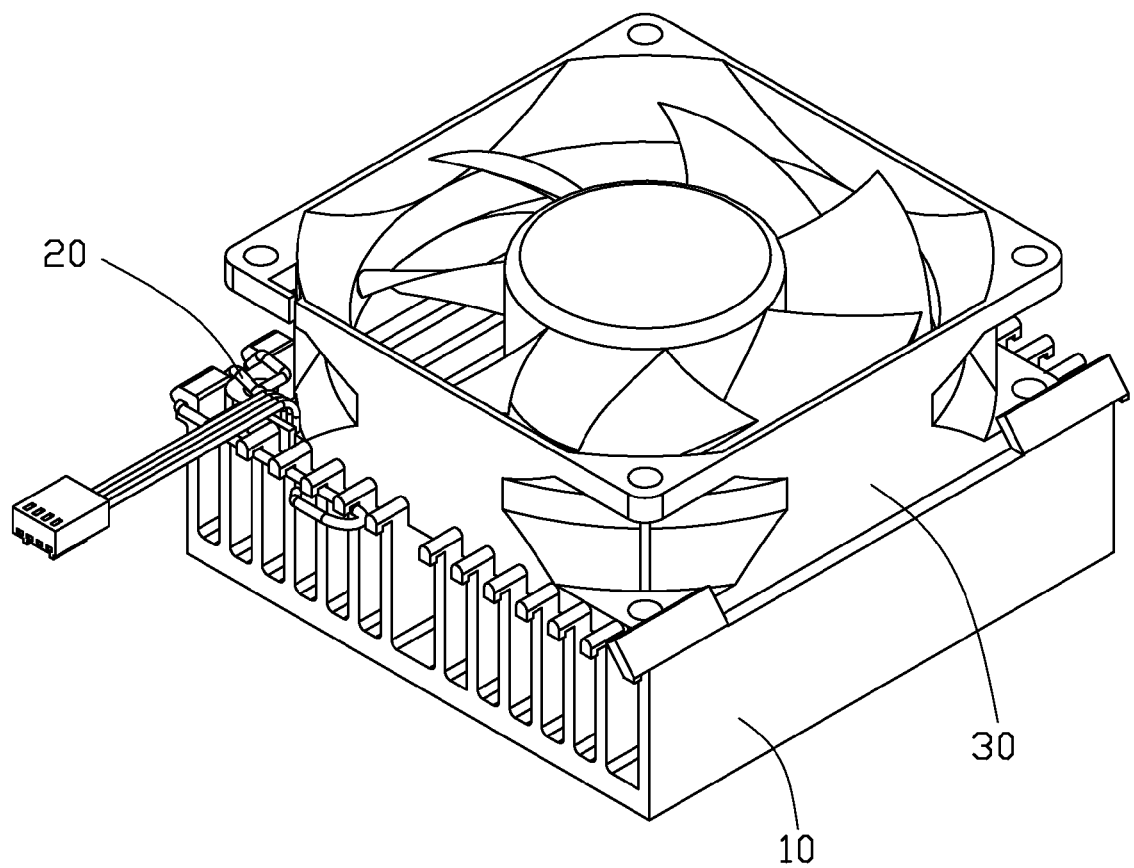
FIG. 2 is an assembled view of the heat dissipation device of FIG. 1, but shown from another aspect.

Referring to FIGS. 1-2, an embodiment of a heat dissipation device comprises a heat sink 10, a fan 30 mounted on a top side of the heat sink 10 and two clips 20 pivotally engaging with the heat sink 10 to secure the fan 30 to the heat sink 10.

Figure 3:
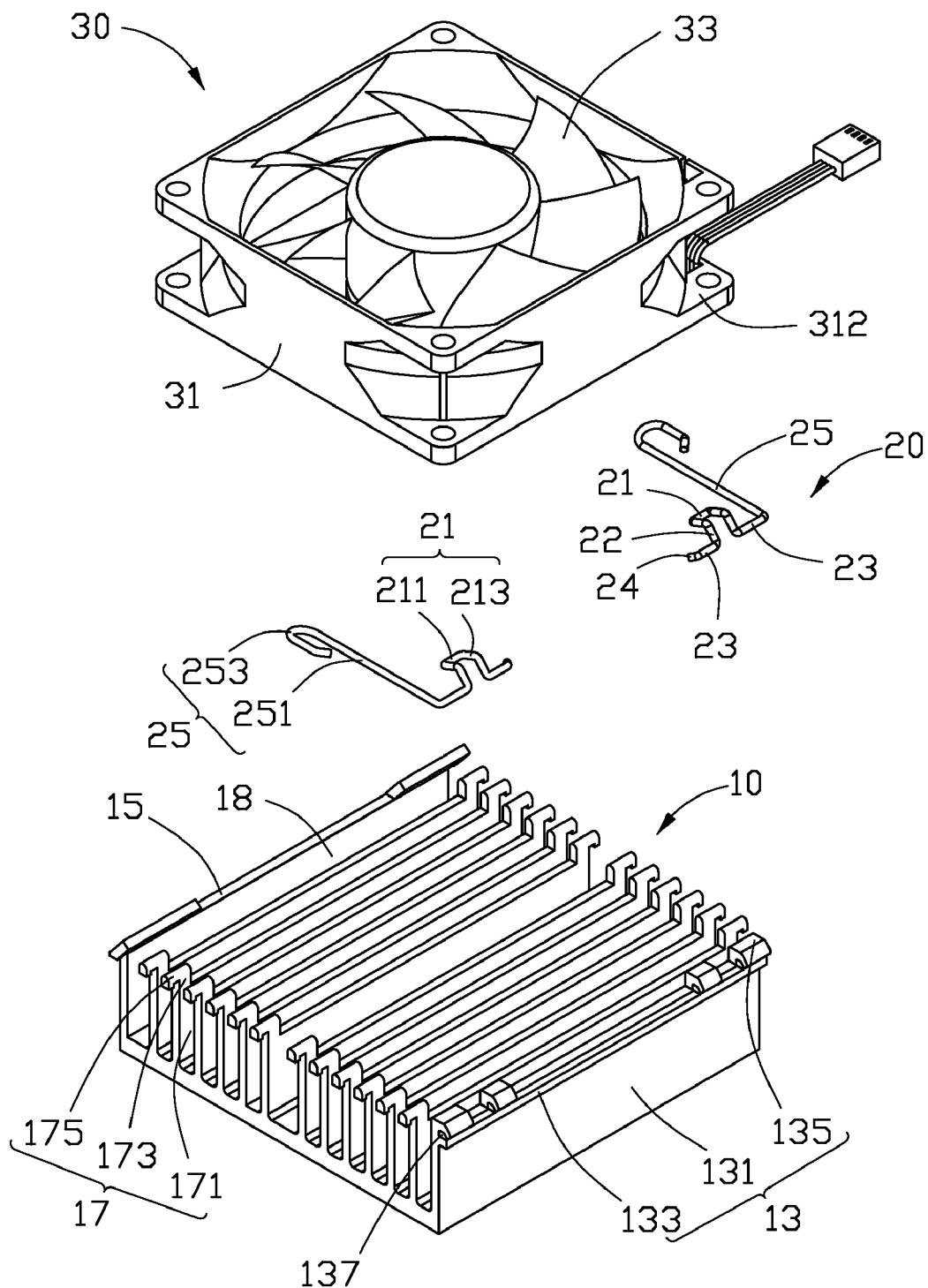
FIG. 3 is an exploded view of the heat dissipation device in FIG. 1.
Figure 4:
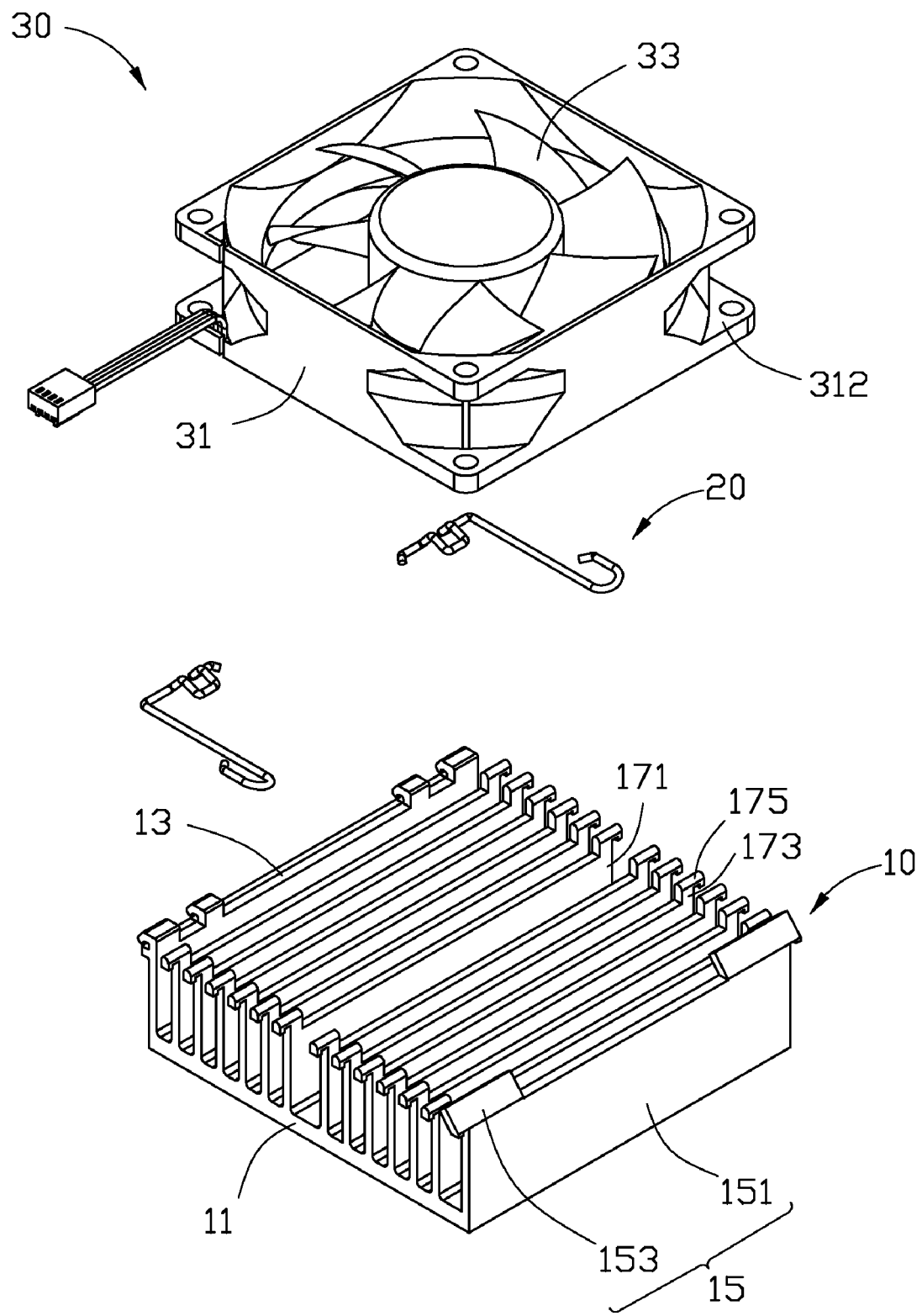
FIG. 4 is an exploded view of the heat dissipation device in FIG. 2.

Referring to FIGS. 3-4, the heat sink 10 comprises an elongated base 11, a first fin 13, a second fin 15 and a number of third fins 17. The first, second and third fins 13, 15 and 17 extend upwardly from a top surface of the base 11 and spaced from each other. The first and second fins 13, 15 are located at front and rear edges of the base 11, respectively. The third fins 17 are positioned between the first and second fins 13, 15.

The first fin 13 comprises an elongated first body 131, a supporting portion 133 and two pairs of pressing portions 135. The first body 131 is a flat plate and perpendicularly connects with the base 11. The supporting portion 133 is an elongated strip and protrudes forwardly from a top portion of the first body 131. A length of the supporting portion 133 is equal to a length of the first body 131. The two pairs of pressing portions 135 are located at opposite ends of the top portion of the first body 131 and above the supporting portion 133. Each pressing portion 135 is a bent tab which has a vertical portion extending upwardly from the top portion of the first body 131 and a bent portion extending forwardly from the vertical portion over the supporting portion 133. Thus, a groove 137 is defined between the bent portion of each of the two pairs of pressing portions 135 and the supporting portion 133. The two pairs of pressing portions 135 are spaced from each other along a length direction of the first body 131.

The second fin 15 comprises an elongated second body 151 and two baffling portions 153. The second body 151 perpendicularly and integrally connects with the base 11 and is parallel to the first body 131 of the first fin 13. Opposite lateral ends of the second body 151 align with opposite lateral ends of the first body 131 of the first fin 13, respectively. The two baffling portions 153 are elongated plate and extend slantwise and upwardly from the opposite lateral ends of a top portion of the second body 151 and are oriented toward the first fin 13. The outmost ends of the two baffling portions 153 are beyond the lateral ends of the second body 151. Each of the baffling portions 153 has an inner surface close to the first fin 13 and an outer surface opposite to the inner surface. The inner surfaces of the two baffling portions 153 are coplanar and baffle the fan 30 when mounting the fan 30 on the heat sink 10.

The third fins 17 are parallel to and spaced from each other. Each of the third fins 17 comprises an elongated third body 171, two blocking portions 173, and two L-shaped clasps 175. The third body 171 perpendicularly and directly connects with the base 11 and is parallel to the first body 131 of the first fin 13 and the second body 151 of the second fin 15. Opposite lateral ends of the third body 171 align with the opposite lateral ends of the first body 131 of the first fin 13, respectively. The two blocking portions 173 of the third fin 17 extend upwardly from a top end of opposite lateral portions of the third body 171, respectively. The two clasps 175 perpendicularly extend outwardly from lateral ends of the two blocking portions 173, respectively. The clasp 175 and the blocking portion 173 form an inverted U-shaped configuration. The clasps 175 engage with the clips 20, respectively.

Heights of the first, second and third bodies 131, 151, 171 of the first, second and third fins 13, 15, 17 are equal to each other. Length of the first, second and third bodies 131, 151, 171 of the first, second and third fins 13, 15, 17 are equals to that of the base 11. Top surfaces of the pressing portions 135 of the first fin 13 and top ends of the blocking portions 173 of the third fins 17 are coplanar and lower than top ends of the baffling portions 153 of the second fin 15. A recess 18 is defined in a top of the heat sink 10 and enclosed by top ends of the first and second bodies 131, 151 of the first and second fins 13, 15 and the blocking portions 173 of the third fins 17. The fan 30 is received in the recess 18 and supported by top ends of the third bodies 171. A periphery of the fan 30 abuts against the inner surfaces of the baffling portions 153, inner surfaces of the blocking portions 173 and rear surfaces of the pressing portions 135.

Each of the clips 20 is a wire clip which is integrally made of a metal wire. Each of the clips 20 comprises a U-shaped engaging portion 21, two transition portions 22, two pivoting portions 23, a hamulus 24, and an operating portion 25. The engaging portion 21 presses the fan 30. The engaging portion 21 comprises a straight connecting portion 211 and two extending portions 213 perpendicularly extending outwardly from opposite ends of the connecting portion 211, respectively. The two transition portions 22 extend slantwise and downwardly from two ends of two the extending portions 213, respectively. The transition portions 22 are sandwiched between confronting ends of a pair of the pressing portions 135 of first fin 13. A distance between the two transition portions 22 is smaller than or approaches a distance between the confronting ends of the pair of the pressing portions 135.

The two pivoting portions 23 perpendicularly extend from the two ends of the two transition portions 22 respectively and are oriented toward opposite directions. The pivoting portions 23 pivotally engage in the groove 137 of the first fin 13. The hamulus 24 extends slantwise from an end of one of the pivoting portions 23 and is oriented towards the engaging portion 21. The hamulus 24 abuts against an outer end of an inner one of the pair of pressing portions 135. The operating portion 25 perpendicularly extends from an end of another pivoting portion 23 to be located beside the engaging portion 21 and is oriented substantially parallel to the engaging portion 21. The operating portion 25 comprises a straight pole 251 and an L-shaped handle 253 extending from an end of the pole 251. The straight pole 251 engages with the clasps 175 of the third fins 17. The handle 253 is located at an outside of the heat sink 10.

The fan 30 comprises a cubical bracket 31 and a blade assembly 33 received in the bracket 31. Middle portions of four corners of the bracket 31 are recessed; thus, four triangular mounting portions 312 are formed at bottom end of the bracket 31. Two of the mounting portions 312 are pressed by the two clips 20.

Figure 5:
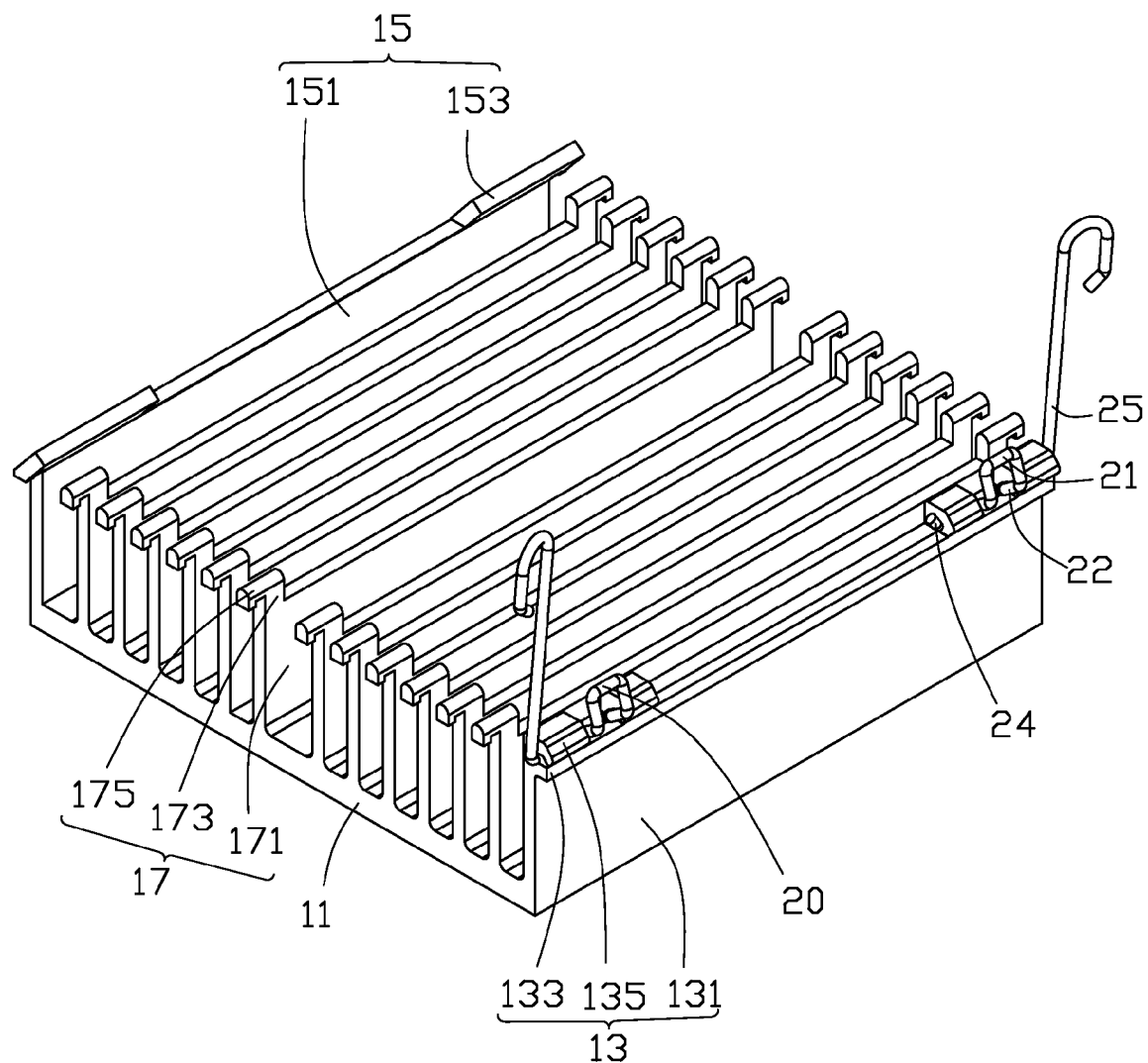
FIG. 5 is an assembled view of a heat sink and clips of the heat dissipation device in FIG. 3.

Referring to FIG. 5, in assembly, the clips 20 are assembled to the heat sink 10 firstly. The clip 20 is pressed towards the heat sink 10. The transition portions 22 of the clip 20 are sandwiched between the confronting ends of one pair of the pressing portions 135 of the first fin 13. The pivoting portions 23 are received in the groove 137 of the first fin 13. The hamulus 24 abuts against the outer end of the inner one of the pair of pressing portions 135. The operating portion 25 is located at an outside of the heat sink 10. The foremost ends of the pressing portions 135 are bent downwardly; a distance between the foremost ends of the pressing portions 135 and the supporting portion 133 is slightly smaller than a diameter of each of the pivoting portions 23 of the clip 20. Therefore, the clip 20 firmly engages with the heat sink 10.

Referring to FIGS. 1-2 again, a bottom end of the fan 30 is received in the recess 18 of the heat sink 10. The fan 30 abuts against the inner surface of the baffling portions 153 of the second fin 15, the rear surfaces of the pressing portions 135 of the first fin 13, the inner surfaces of the blocking portions 173 and the top ends of the third bodies 171 of the third fins 17. The operating portion 25 of the clip 20 is pressed downwardly until the pole 251 of the operating portion 25 locks into the clasps 175 of the third fins 17. Meanwhile, the pivoting portions 23 rotate along an anti-clock direction, and the engaging portion 21 rotates toward the mounting portion 312 of the fan 30 until the engaging portion 21 tightly presses the mounting portion 312. As a result, the fan 30 is fixed on the heat sink 10.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat dissipation device comprising:
  a heat sink comprising a base, and a first fin comprising a first body protruding from a top surface of the base, a first supporting portion extending outwardly from a top end of the first body and a first pressing portion extending upwardly and outwardly from the top end of the first body, the first pressing portion being spaced from the first supporting portion;
  a fan being mounted on a top side of the heat sink, the fan comprising a bracket; and
  a clip comprising a pivoting portion being pivotally sandwiched between the first pressing portion and the first supporting portion of the first fin of the heat sink, an engaging portion connecting with an end of the pivoting portion and an operating portion extending from the other end of the pivoting portion, wherein when the operating portion is operated to engage with the heat sink, the engaging portion rotates with respect to the bracket of the fan and presses the bracket of the fan downwardly toward the heat sink to thereby secure the fan on the top side of the heat sink.

2. The heat dissipation device as claimed in claim 1, wherein the heat sink further comprises a plurality of second fins which are spaced from the first fin, each of the second fins comprises a second body and a clasp extending outwardly from a lateral side of the second body, a bottom portion of the fan abuts against top ends of the second bodies of the second fins, and the operating portion of the clip locks into the clasps of the second fins.

3. The heat dissipation device as claimed in claim 2, wherein each of the second fins comprises two blocking portions extending upwardly from the top end of the second body and spaced from each other, the clasp extends outwardly from a lateral side of one of the blocking portions, and the bracket of the fan abuts against inner surfaces of the blocking portions.

4. The heat dissipation device as claimed in claim 1, wherein a second fin extends upwardly from an end of the base and is opposite to the first fin, the second fin comprises a second body and a baffling portion extending slantwise from a top end of the second body, and the baffling portion abuts against a sidewall of the bracket of the fan.

5. The heat dissipation device as claimed in claim 3, wherein the engaging portion of the clip is U-shaped and comprises a connecting portion and two extending portions extending outwardly from opposite ends of the connecting portion, and the pivoting portion connects with one of the extending portions and the operating portion of the clip.

6. The heat dissipation device as claimed in claim 5, wherein two transition portions extend slantwise from two ends of the two extending portions of the engaging portion, respectively, and one of the transition portions connects with the pivoting portion.

7. The heat dissipation device as claimed in claim 6, wherein the other pivoting portion extends from the other transition portion and is sandwiched between a second pressing portion and a second supporting portion which are located at inner sides of the first pressing portion and first supporting portion of the first fin, and the engaging portion of the clip is sandwiched between confronting ends of the first and second pressing portions.

8. The heat dissipation device as claimed in claim 1, wherein the bracket of the fan further comprises a mounting portion near a corner of the bracket, and wherein when the operating portion is operated to engage with the heat sink, the engaging portion rotates with respect to the bracket of the fan and presses the mounting portion of the bracket of the fan toward the heat sink.

9. The heat dissipation device as claimed in claim 7, wherein a recess is laterally defined in the bracket above the mounting portion of the bracket, and the engaging portion extends into the recess to press the mounting portion of the bracket of the fan toward the heat sink.

10. A heat dissipation device comprising:
a heat sink comprising a base, a first fin, and a second fin, the first and second fins extending upwardly from a top surface of the base and spaced from each other, the first fin comprising a first body protruding from the top surface of the base, a supporting portion extending outwardly from a top end of the first body and two spaced pressing portions extending upwardly and outwardly from the top end of the first body, the pressing portions spaced from the supporting portion, the second fin comprising a second body and a clasp formed on a lateral side of the second body;
a fan mounted on a top side of the heat sink, the fan comprising a bracket; and
a clip comprising two pivoting portions, an engaging portion being sandwiched between and connected to the two pivoting portions and an operating portion extending from an end of one of the pivoting portions, the two pivoting portions being pivotally sandwiched between the pressing portions and the supporting portion of the first fin of the heat sink, the engaging portion being sandwiched between the two pressing portions of the first fin of the heat sink;
wherein when the operating portion of the clip is operated to engage with the heat sink, the two pivoting portions rotate with respect to the two pressing portions of the first fin of the heat sink to enable the engaging portion to press the bracket of the fan toward the heat sink, and the operating portion locks in the clasp of the second fin of the heat sink.

11. The heat dissipation device as claimed in claim 10, wherein the second fin further comprises two blocking portions extending upwardly from a top end of the second body, the clasp is formed on a lateral side of one of the blocking portions, and opposite portions of the bracket of the fan abut against inner surfaces of the blocking portions.

12. The heat dissipation device as claimed in claim 10, wherein a second fin extends upwardly from an end of the base and is opposite to the first fin, the second fin comprises a second body and a baffling portion extending slantwise from a top end of the second body, and the baffling portion abuts against the bracket of the fan.

13. The heat dissipation device as claimed in claim 10, wherein the clip is integrally made of a metal wire.

14. The heat dissipation device as claimed in claim 10, wherein the engaging portion of the clip has a U-shaped configuration and two ends of the engaging portion connect with the two pivoting portions, respectively.

15. A heat dissipation device comprising:
a heat sink comprising a base, a first fin and a second fin extending from the base and spaced from each other, the second fin having a body protruding from a top surface of the base and a baffling portion extending slantwise from a top end of the body;
a fan being mounted on a top side of the heat sink, the fan comprising a bracket; and
a clip comprising a pivoting portion being pivotally engaging with the first fin of the heat sink, an engaging portion connecting with an end of the pivoting portion, and an operating portion extending from the other end of the pivoting portion;
wherein when the operating portion is operated to engage with the heat sink, the engaging portion rotates with respect to the bracket of the fan and presses a side of the bracket of the fan downwardly toward the heat sink and the baffling portion of the second fin abuts against another side of the bracket of the fan to thereby secure the fan on the top side of the heat sink.

16. The heat dissipation device as claimed in claim 15, wherein the first fin has a body protruding from the top surface of the base, a supporting portion extending outwardly from a top end of the body of the first fin, and a pressing portion extending upwardly and outwardly from the top end of the body of the first fin, the pressing portion is spaced from the supporting portion, and the pivoting portion of the clip is pivotally sandwiched between the pressing portion and the supporting portion of the first fin.

17. The heat dissipation device as claimed in claim 16, wherein the first fin and the second fin are located at opposite sides of the base, and the operating portion of the clip and the baffling portion of the second fin press opposite sides of the bracket of the fan.

18. The heat dissipation device as claimed in claim 15, wherein the heat sink further comprises a plurality of third fins which are sandwiched between the first fin and the second fin, each of the third fins comprises a body, two blocking portions extending upwardly from lateral sides of a top end of the body of the third fin, and a clasp extending outwardly from an outer side of one of the blocking portions, a bottom portion of the fan abuts against the top ends of the bodies of the third fins and opposite sides of the bracket of the fan abut against inner surfaces of the blocking portions, and the operating portion of the clip locks into the clasps and abuts the blocking portions of the third fins.

* * * * *